United States Patent [19]

Auerbuch et al.

[11] Patent Number: 5,308,926
[45] Date of Patent: May 3, 1994

[54] COMPACT ISOLATING BACKPLANE FOR ROUTING ELECTRONIC SIGNALS

[75] Inventors: Marcus J. Auerbuch, San Carlos; Boris J. Auerbuch, Belmont, both of Calif.

[73] Assignee: Premisys Communications, Inc., Pal Alto, Calif.

[21] Appl. No.: 988,410

[22] Filed: Dec. 8, 1992

[51] Int. Cl.⁵ .......................... H05K 1/11; H05K 7/02
[52] U.S. Cl. ..................................... 174/250; 361/780; 361/788; 361/794
[58] Field of Search ............... 174/250, 262, 264; 361/410, 414, 778, 780, 788, 792, 794

[56] References Cited

U.S. PATENT DOCUMENTS

| | | | |
|---|---|---|---|
| 3,917,984 | 11/1975 | Kong et al. | 174/68.5 |
| 4,054,939 | 10/1977 | Ammon | 361/414 |
| 4,187,339 | 2/1980 | Cayrol | 361/410 X |
| 4,371,744 | 2/1983 | Badet et al. | 361/410 X |
| 4,553,111 | 11/1985 | Barrow | 361/410 X |
| 4,706,165 | 11/1987 | Takenaka et al. | 361/414 X |
| 4,866,507 | 9/1989 | Jacobs et al. | 174/250 X |
| 4,888,663 | 12/1989 | Longerich et al. | 361/385 |
| 5,155,577 | 10/1992 | Chance et al. | 357/71 |
| 5,214,517 | 5/1993 | Dalgren et al. | 361/414 |
| 5,218,654 | 6/1993 | Sauter | 385/24 |
| 5,224,022 | 6/1993 | Weigler et al. | 361/414 X |

Primary Examiner—Leo P. Picard
Assistant Examiner—L. Thomas
Attorney, Agent, or Firm—Stuart P. Meyer

[57] ABSTRACT

A backplane circuit board for connecting network signal lines, bus signal lines, and a number of circuit cards includes a first set of traces from a first network signal connector to connectors for the circuit cards, and a second set of traces from a bus signal connector to the connectors for the circuit cards. The first set of traces and the second set of traces are separated by a uniform distance to provide electrical isolation from one another. The traces are made up of signal-active lines surrounded by signal-neutral lines for further electrical isolation. As one other mechanism for signal isolation, the backplane provides signal-neutral lines on a separate layer from, and in superposition to, the signal-active lines.

18 Claims, 9 Drawing Sheets

COMPACT ISOLATING BACKPLANE FOR ROUTING ELECTRONIC SIGNALS

BACKGROUND AND FIELD OF THE INVENTION

This invention relates generally to electronic circuitry, and more specifically to a backplane printed circuit for routing digital and analog telephone signals among circuit cards connected to the backplane.

A number of conventional methods and systems are known for connecting telephone network lines to digital telephone exchange equipment. In one established technique, each network line is connected to a separate communication equipment printed circuit input card, and bus signal lines are connected from each such input card to processing circuitry. This method is advantageous in that each input card acts as a buffer to isolate one network line from another and from bus signal lines. However, each network line connection must be made directly to each card, and the network line cable must be detached from the input card in order to remove the input card for repair or replacement. In a typical exchange with a large number of network lines, such cable manipulation is awkward and confusing.

In a second conventional technique, all network line connections are grouped together within a single cable and are connected to a backplane via an input connection card or a connector directly on the backplane. This scheme permits easy removal and replacement of input cards, but typically results in undesired cross coupling of signals among network lines or between network lines and other signals in the telephone exchange equipment.

It would be desirable to provide a simple means of connection between network lines and digital exchange equipment in a manner that allows fast and easy replacement of input cards while providing good isolation of network lines.

SUMMARY OF THE INVENTION

In order to overcome the limitations of conventional approaches, this invention incorporates a multiplanar backplane configuration to maintain a relatively constant physical distance between network signal lines and bus signal lines while surrounding each network signal line with neutral signal lines to reduce the likelihood of cross-coupling.

The features and advantages described in the specification are not all-inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE DRAWINGS

The Figures depict a preferred embodiment of the present invention for purposes of illustration only. One skilled in the art will readily recognize from the following discussion that alternative embodiments of the structures and methods illustrated herein may be employed without departing from the principles of the invention described herein.

Figure 1:
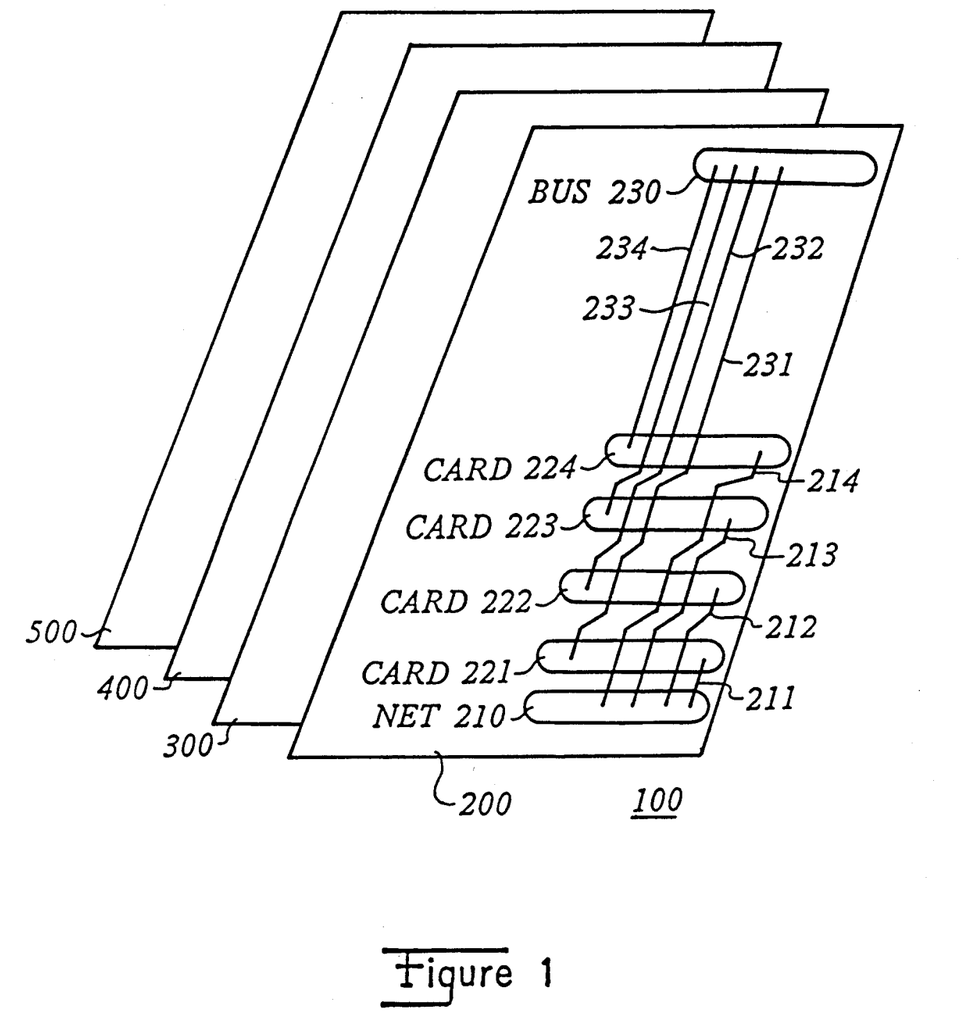
FIG. 1 is an expanded view of a multiplanar backplane circuit board in accordance with the present invention.

Referring now to FIG. 1, there is shown a backplane circuit board 100, in accordance with the present invention. The purpose of board 100 is to interconnect network circuitry (not shown) via network connector 210, printed circuit cards (not shown) via card connectors 221-224, and processing circuitry (not shown) via bus connector 230. In one typical environment of operation, the network circuitry is conventional telephone network circuitry, the printed circuit cards are conventional circuits for converting signals from the conventional telephone network circuitry to digital bus signals, the processing circuitry is digital circuitry for processing bus signals, and the connectors 210-214, 230 are conventional connectors for mounting on a printed circuit board. Extremely high reliability requirements of systems operating in such environments call for a very short mean time to repair (MTTR) should one of the circuit cards become faulty. In the embodiment illustrated in FIG. 1, repair time is extremely short because cards can be replaced simply by unplugging a defective card from a corresponding card connector, e.g., 221, and plugging the new card into that also now to FIG. 5, traces corresponding to signal flow in a direction from bus connector 230 to network connector 210 are located on layer 500, and route bus signals from bus connector 230 to card connectors 221-224 via traces 531-534, as well as routing network signals from card connectors 221-224 to network connector 210 via traces 511-514.

Figure 2:
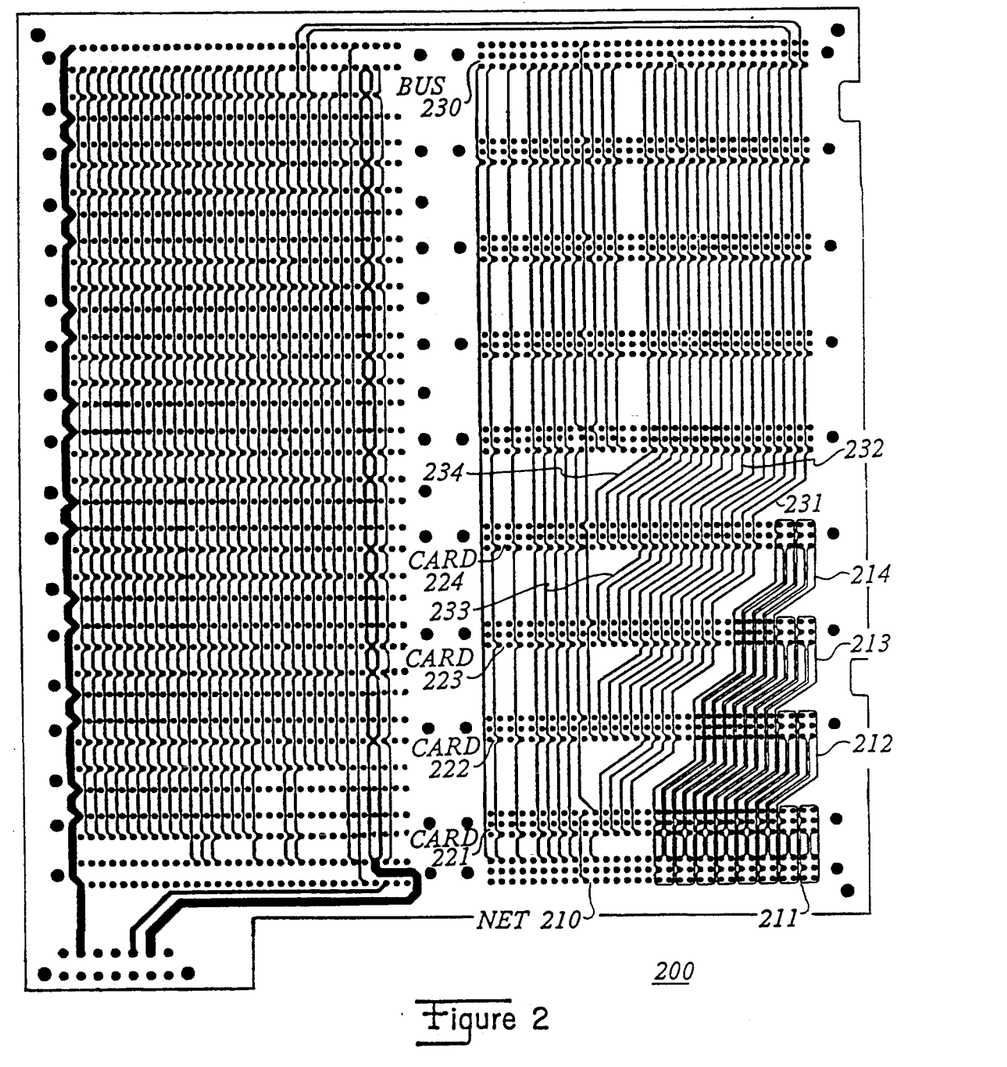
FIG. 2 is a mask of a first layer of the backplane circuit board illustrated in FIG. 1.

Referring now to FIG. 2, the traces for signal flow from network connector 210 to bus connector 230 on circuit board layer 200 are shown. Specifically, network signals from connector 210 flow to card connectors 221-224 via traces 211-214, respectively, and bus signals from card connectors 221-224 flow to bus connector 230 via traces 231-234, respectively. Other traces shown on FIG. 2 pertain to other signals and connectors not related to the present invention. FIGS. 2-5 are trace masks, in which black areas indicate an insulating board material and white areas indicate deposition of a conductive material on the insulating board material. In the preferred embodiment, the insulating board material is standard epoxy printed circuit board, and the conductive material is conventional etched copper.

Figure 3:
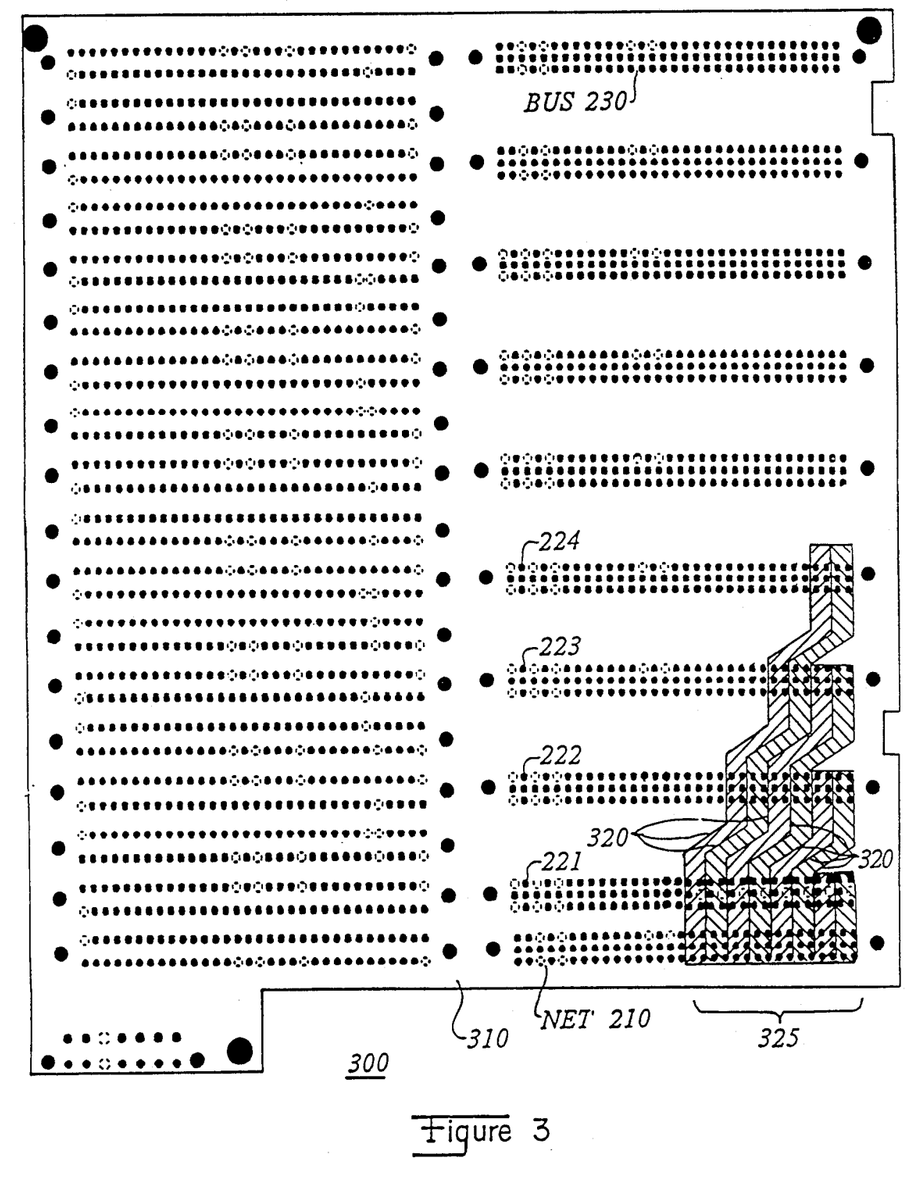
FIG. 3 is a mask of a second layer of the backplane circuit board illustrated in FIG. 1.

Referring now to FIG. 3, the configuration for negative power connection (power ground) on circuit board layer 300 is shown. The negative power connection provides a portion of the d.c. power path required to power circuit cards connected to card connectors 221-224 and may also provide power to circuitry connected to network and connector, e.g., 221. All network and bus connections to the card are made via that connector, e.g., 221, so no further work is required for card replacement.

Referring still to FIG. 1, the specific means by which network circuitry signals from network connector 210 and bus signals from bus connector 230 are routed to each of the circuit card connectors 221-224 are network traces 211-214 and bus traces 231-234 etched onto the layers, e.g., 200 of backplane circuit board 100. The topology of network connector 210, card connectors 221-224, bus connector 230, and traces 211-214 as illustrated in FIG. 1 allows a relatively large number of circuit card connectors 221-224 to be located in a small area of backplane circuit board 100 while maintaining significant physical separation between network signal traces 211-214 and bus signal traces 231-234.

In the preferred embodiment, backplane circuit board 100 is made up of four layers 200, 300, 400, and 500 on which traces, e.g., 211 are disposed. In the preferred embodiment, traces corresponding to signal flow in a direction from network connector 210 to bus connector 230 are located on layer 200, and route network signals from network connector 210 to card connectors 221-224 via traces 211-214, as well as routing bus signals from card connectors 221-224 to bus connector 230 via bus traces 231-234. Traces for supplying a negative connection to a power supply voltage are located on layer 300. Traces for supplying a positive connection to a power supply voltage are located on layer 400. Referring processing circuitry connected with connectors 210, 230, respectively. A portion 325 of layer 300 also serves as neutral signal connections. The traces 320 of portion 325 are etched in the layer 300 and are isolated from one another and from the remainder of layer 300. Traces 320 are relatively wide and are disposed in superposition to traces 211-214 of FIG. 2 in order to provide electrical shielding of traces 211-214 from undesired signals.

Figure 4:
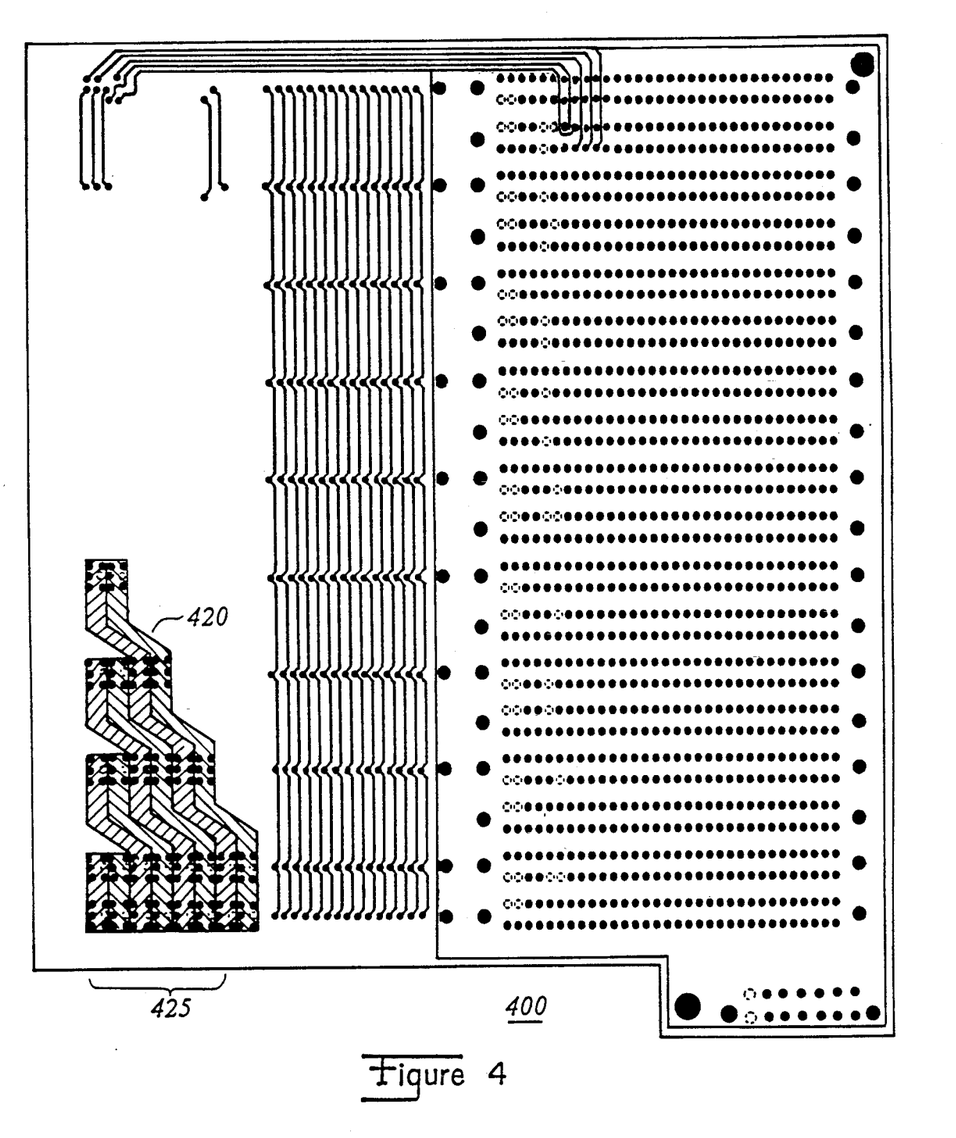
FIG. 4 is a mask of a third layer of the backplane circuit board illustrated in FIG. 1.

Referring now to FIG. 4, the configuration for positive power connection on circuit board layer 400 is shown. As with the negative power connection of FIG. 3, the positive power connection of FIG. 4 provides a portion of the d.c. power path required to power circuit cards connected to card connectors 221-224 and may also provide power to circuitry connected to network and processing circuitry connected with connectors 210, 230, respectively. Connectors 210, 221-224 and 230 are largely obscured by the black area of FIG. 4. A portion 425 of layer 400 also serves as neutral signal connections. The traces 420 of portion 425 are etched in the layer 400 and are isolated from one another and from the remainder of layer 400. Traces 420 are relatively wide and are disposed in superposition to traces 511-514 of FIG. 5 in order to provide electrical shielding of traces 511-514 from undesired signals. Due to the conventional mechanics of printed circuit board fabrication, the masks of FIGS. 4 and 5 are horizontally transposed with respect to those of FIGS. 2 and 3 so that, for instance, the right-most portion of layer 200 in FIG. 2 is disposed in vertical alignment with the left-most portion of layer 500 in FIG. 5 when layers 200-500 are assembled to form board 100.

Figure 5:
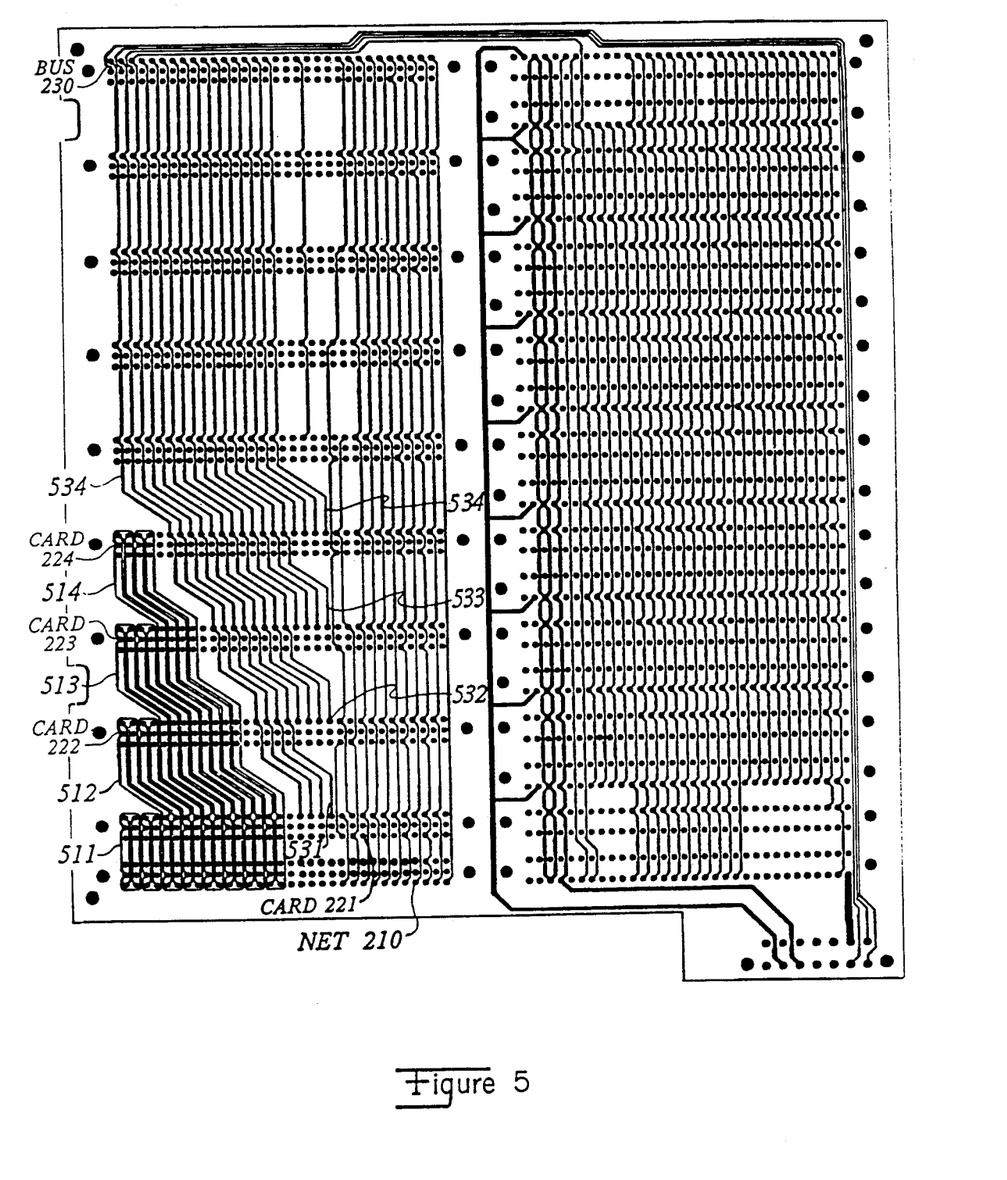
FIG. 5 is a mask of a fourth layer of the backplane circuit board illustrated in FIG. 1.

Referring now to FIG. 5, traces 511-514 of circuit board layer 500 are shown. As previously discussed, the signals on layer 500 are similar to, but flow in the opposite direction from, the signals described with regard to layer 200. Thus, bus signals from connector 230 are supplied to card connectors 221-224 via traces 531-534, respectively. Network signals from card connectors 221-224 are then supplied to network connector 210 via traces 511-514, respectively.

Figure 6:
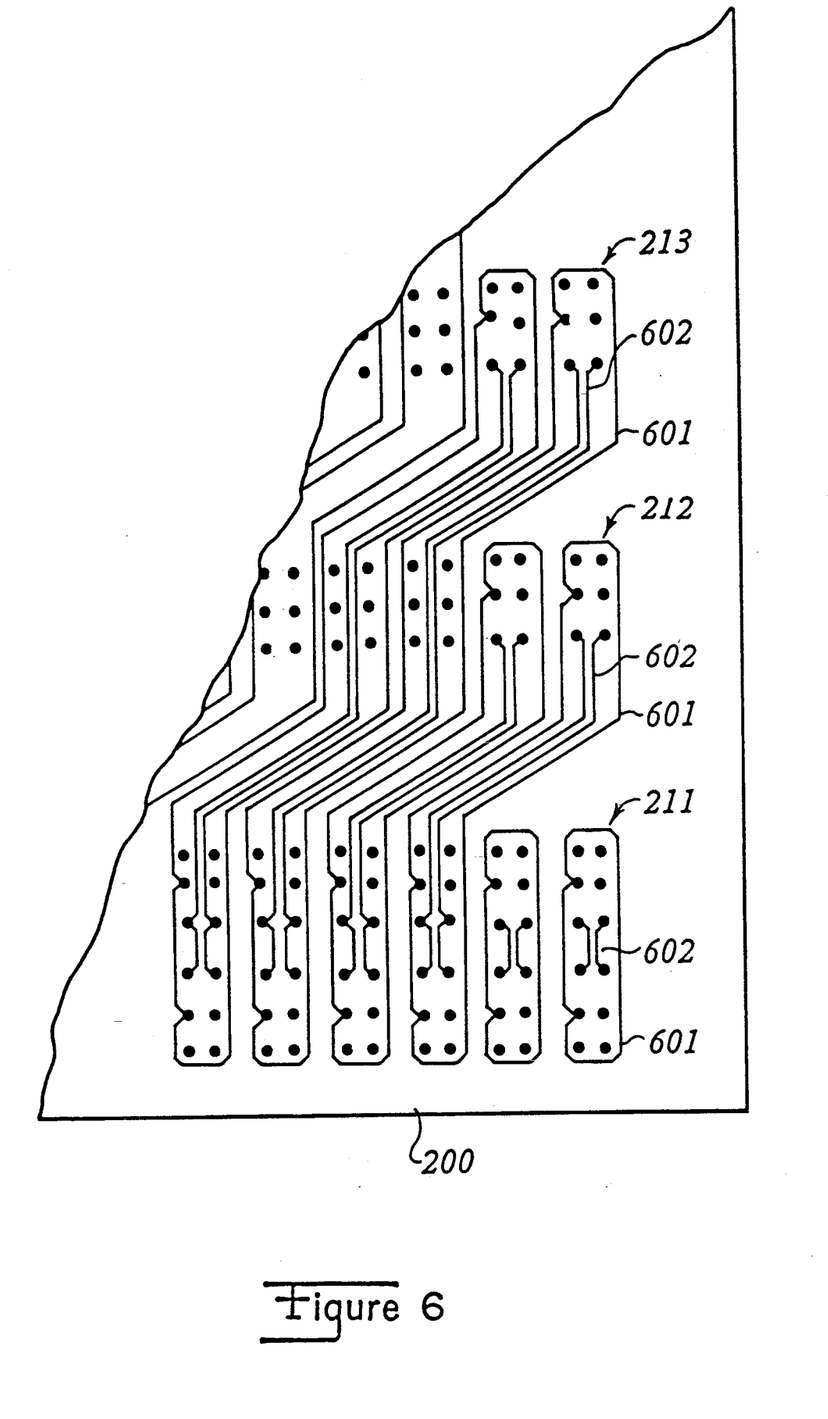
FIG. 6 is an illustration detailing a portion of the layout of the mask of FIG. 2.

Referring now to FIG. 6, there is shown a detail of a portion of layer 200. In accordance with the present invention, traces (e.g., 211, 212, 213) are disposed so that signal-neutral lines 601 of each trace, e.g., 213, completely surround signal-active lines 602 of that trace, to provide shielding from undesired signals or noise.

Figure 7A:
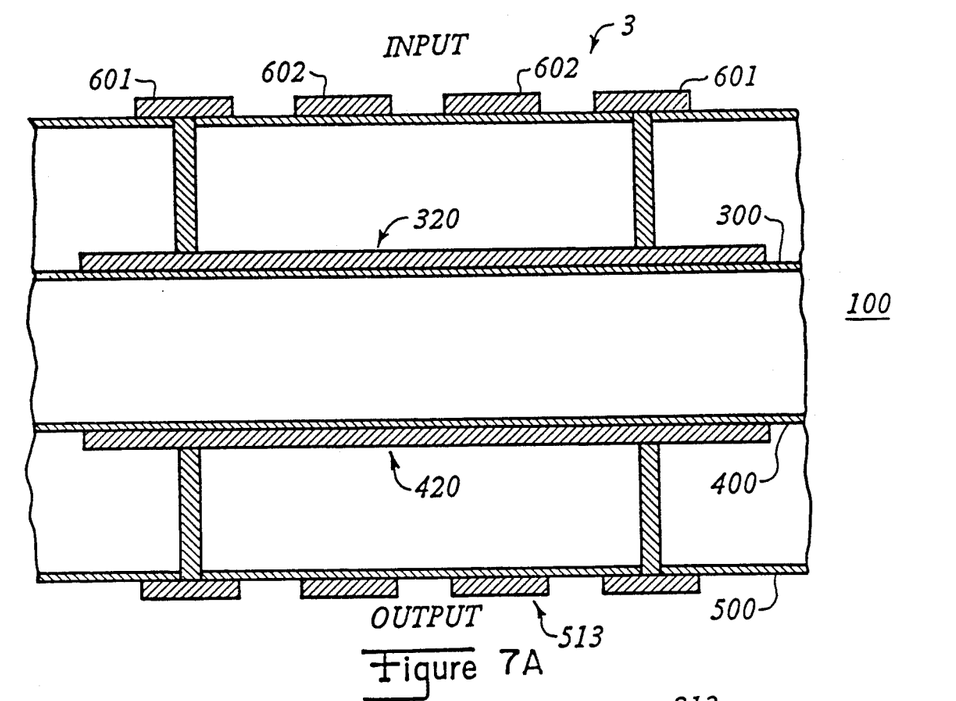
FIG. 7a is a side view of a portion of the multiplanar backplane circuit board of FIG. 1.
Figure 7B:
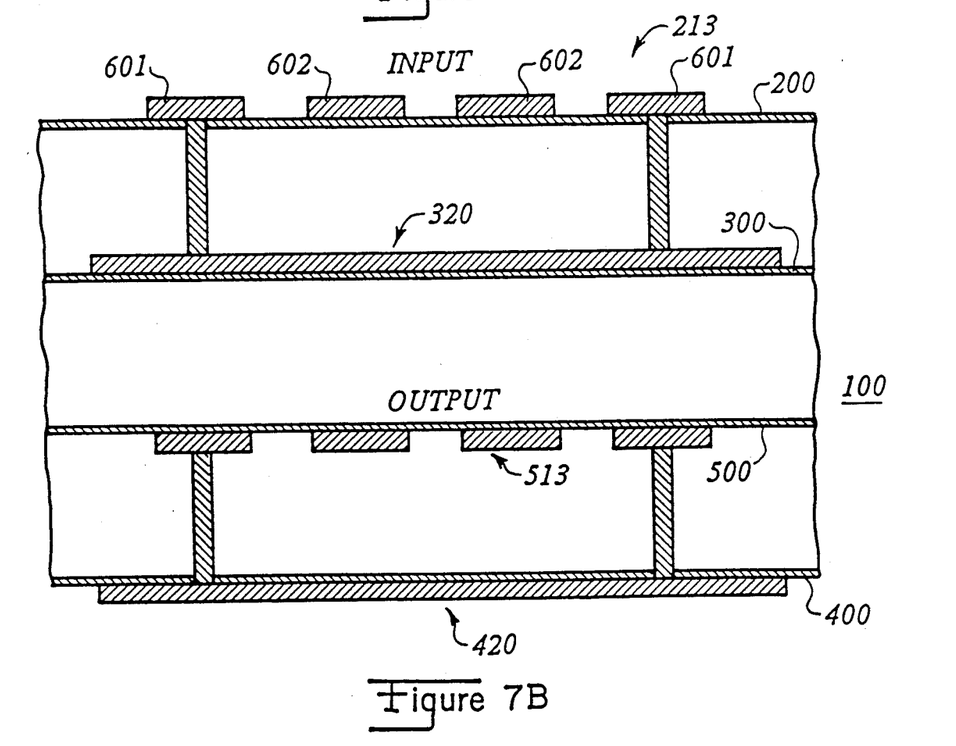
FIG. 7b is a side view of a portion of an alternative multiplanar backplane circuit board in accordance with the present invention.

Referring now to FIG. 7a, there is shown a cutaway end view of a portion of backplane circuit board 100. In the preferred embodiment, board layers 200-500 are disposed on top of one another such that input signal traces 213, including signal-active lines 602 and signal-neutral lines 601 are isolated from their output signal trace counterparts 513 by signal neutral traces 320, 420. In an alternative embodiment, illustrated in FIG. 7b, input and output traces 213 and 513, respectively, are separated by signal neutral traces 320, while signal neutral traces 420 serve to isolate both input and output traces 213, 513 from undesired signals or noise propagating from outside of board 100 toward the layer 400 of board 100. The isolation provided through this topology is advantageous not only in reducing crosstalk between channels, but also in helping to prevent a voltage surge or spike caused by board malfunction, electromagnetic radiation or lightning strike incident on one circuit from deleteriously affecting other circuits interconnected by backplane board 100.

Figure 8:
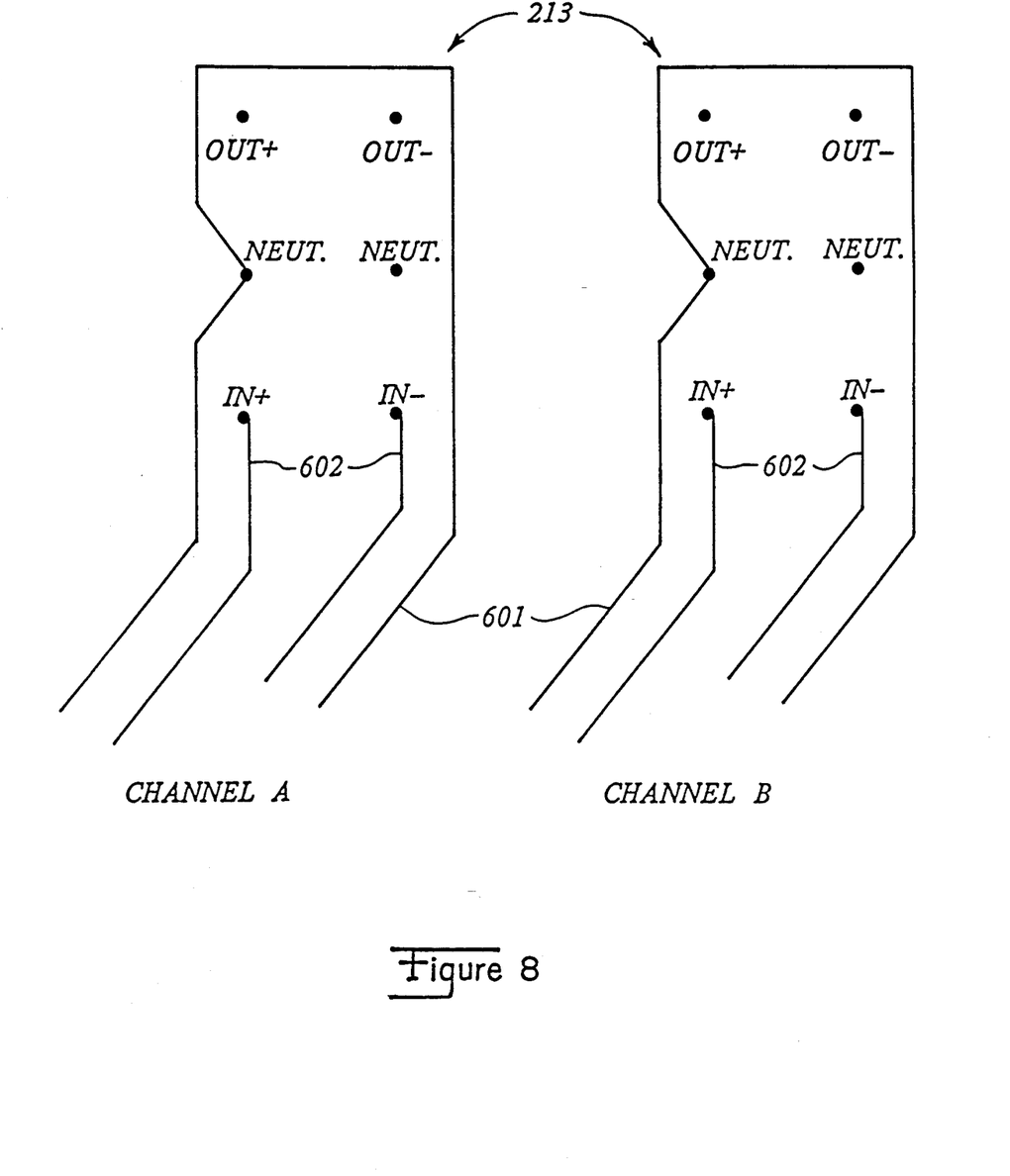
FIG. 8 is a detail view of the layer illustrated in FIG. 2.

Referring now to FIG. 8, there is shown a detailed view of a portion of trace 213 on layer 200 in the vicinity of card connector 223. In the preferred embodiment, signal neutral lines 601 of trace 213 surround two differential signal lines 602 for each of two channels A and B, thereby forming a shield around those lines. Since layer 200 in the preferred embodiment carries only input-direction signals, signal-active lines 602 lead to connection points labeled IN+ and IN−, and no signal lines lead to connection points labeled OUT+ or OUT−. The connection points in FIG. 8 labeled IN and OUT each refers to conventional network (analog) "TIP" and "RING" signals. Signal neutral lines 601 on layer 200 physically surround signal active lines 602. Bus input and output signals (e.g., those connected with traces 231-234) are disposed on a different portion of backplane circuit board 100, as shown on FIGS. 1-5.

In an alternative embodiment of the invention, circuit cards engaging with card connectors, e.g., 221, could be configured to connect with plural traces, e.g., 212, 213, rather than a single trace, to provide automatic redundancy should the primary card servicing a particular trace malfunction. Specifically, if a card inserted at connector 221 was configured to electrically connect with traces 212, 213, and 214, as well as trace 211, that card might be able to provide processing for signals on traces 212-214 should any of the cards connected at connectors 222-224 malfunction.

Figure 9:
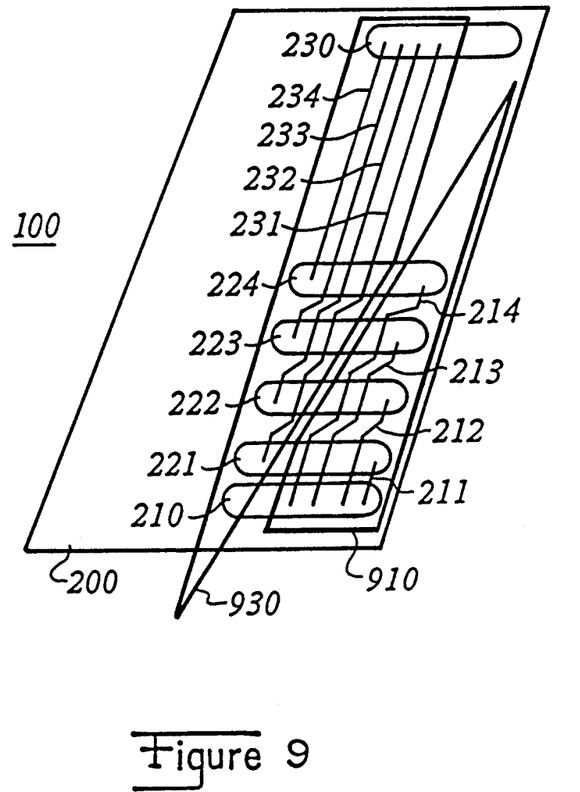
FIG. 9 is a view of the backplane circuit board of FIG. 1 illustrating trapezoidal configuration of circuit connections in accordance with the present invention.

Referring now to FIG. 9, there is shown layer 200 of circuit board 100, with connectors 210, 221-224, and 230, and with bus traces 211-214 and network traces 231-234. FIG. 9 illustrates that the configuration of bus traces 211-214 results in a topology generally in the shape of a trapezoid 920. Similarly, network traces 231-234 are configured generally in the shape of trapezoid 930. The long diagonal side of trapezoid 910 is parallel to the long diagonal side of trapezoid 930, thus providing a constant spacing separating bus traces 211-214 from network traces 231-234.

From the above description, it will be apparent that the invention disclosed herein provides a novel and advantageous compact isolating backplane for routing electronic signals, which employs a constant separation between a first set of traces and a second set of traces in order to maximize shielding. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A backplane board for electronic apparatus, the backplane board providing a first set of connections between a first set of signal lines and a plurality of circuit cards, the backplane board also providing a second set of connections between a second set of signal lines and the plurality of circuit cards, the backplane board comprising:
   a first connector for said first set of signal lines;
   a second connector for said second set of signal lines;
   a plurality of linearly-disposed circuit card connectors corresponding to said plurality of circuit cards;
   a first set of traces leading from said first connector to said circuit card connectors; and
   a second set of traces leading from said second connector to said circuit card connectors; said first and second sets of traces being disposed so that said first set of traces and said second set of traces are separated by a substantially uniform distance over a span defined by said plurality of linearly-disposed circuit card connectors.

2. The backplane board of claim 1, wherein said linearly-disposed circuit card connectors are disposed substantially between said first and second connectors.

3. The backplane board of claim 2, wherein said circuit card connectors, said first connector and said second connector are substantially collinear.

4. The backplane board of claim 1, wherein said first set of traces includes a plurality of signal-active lines and a plurality of signal neutral lines, and wherein said signal-neutral lines each are disposed to form a perimeter surrounding a corresponding one of said signal-active lines.

5. The backplane board of claim 1, wherein said second set of traces includes a plurality of signal-active lines and a plurality of signal neutral lines, and wherein said signal-neutral lines each are disposed to form a perimeter surrounding a corresponding one of said signal-active lines.

6. The backplane board of claim 1, further comprising a plurality of layers upon which said first and second sets of traces are disposed, wherein said traces comprise:
   signal traces disposed on a first layer of said plurality of layers; and
   isolating traces, corresponding to said signal traces, each of said isolating traces having a first portion disposed on said first layer and having a second portion disposed on a second layer of said plurality of layers, said first portion forming a perimeter surrounding a corresponding one of said signal traces and said second portion being disposed substantially in superposition to said corresponding one of said signal traces.

7. The backplane board of claim 1, wherein one of said traces corresponding to a first one of said circuit card connectors is disposed across a second one of said circuit card connectors.

8. The backplane board of claim 7, wherein said trace corresponding to said first circuit card connector makes electrical contact with said second circuit card connector, thereby electrically connecting said trace with a first of said circuit cards upon installation of said first circuit card in said first circuit card connector, and electrically connecting said trace with a second of said circuit cards upon installation of said second circuit card in said second circuit card connector.

9. The backplane board of claim 1, wherein each of said circuit card connectors is connected to a first different subset of said first set of traces, and wherein each of said circuit card connectors is connected to a second different subset of said second set of traces.

10. A backplane board for electronic apparatus, the backplane board providing a first set of connections between a first set of signal lines and a plurality of circuit cards, the backplane board also providing a second set of connections between a second set of signal lines and the plurality of circuit cards, the backplane board comprising:
    a first connector for said first set of signal lines;
    a second connector for said second set of signal lines;
    a plurality of linearly-disposed circuit card connectors corresponding to said plurality of circuit cards;
    a first set of traces leading from said first connector to said circuit card connectors, said first set of traces defining a first trapezoid; and
    a second set of traces leading from said second connector to said circuit card connectors, said second set of traces defining a second trapezoid; said first and second sets of traces being disposed so a diagonal line of said first trapezoid is substantially parallel to a diagonal line of said second trapezoid.

11. The backplane board of claim 10, wherein said linearly-disposed circuit card connectors are disposed substantially between said first and second connectors.

12. The backplane board of claim 11, wherein said circuit card connectors, said first connector and said second connector are substantially collinear.

13. The backplane board of claim 10, wherein said first set of traces includes a plurality of signal-active lines and a plurality of signal neutral lines, and wherein said signal-neutral lines each are disposed to form a perimeter surrounding a corresponding one of said signal-active lines.

14. The backplane board of claim 10, wherein said second set of traces include a plurality of signal-active lines and a plurality of signal neutral lines, and wherein said signal-neutral lines each are disposed to form a perimeter surrounding a corresponding signal-active line.

15. The backplane board of claim 10, further comprising a plurality of layers upon which said first and second sets of traces are disposed, wherein said traces comprise:

signal traces disposed on a first layer of said plurality of layers; and isolating traces, corresponding to said signal traces, each of said isolating traces having a first portion disposed on said first layer and having a second portion disposed on a second layer of said plurality of layers, said first portion forming a perimeter surrounding a corresponding one of said signal traces and said second portion being disposed substantially in superposition to said corresponding one of said signal traces.

16. The backplane board of claim 10, wherein one of said traces corresponding to a first one of said circuit card connectors is disposed across a second one of said circuit card connectors.

17. The backplane board of claim 16, wherein said trace corresponding to said first circuit card connector makes electrical contact with said second circuit card connector, thereby electrically connecting said trace with a first of said circuit cards upon installation of said first circuit card in said first circuit card connector, and electrically connecting said trace with a second of said circuit cards upon installation of said second circuit card in said second circuit card connector.

18. The backplane board of claim 10, wherein each of said circuit card connectors is connected to a first different subset of said first set of traces, and wherein each of said circuit card connectors is connected to a second different subset of said second set of traces.

* * * * *